United States Patent
Kim et al.

(10) Patent No.: US 10,332,685 B2
(45) Date of Patent: Jun. 25, 2019

(54) MULTILAYER CERAMIC CAPACITOR

(71) Applicant: SAMSUNG ELECTRO-MECHANICS CO., LTD., Suwon-Si, Gyeonggi-Do (KR)

(72) Inventors: Mi Young Kim, Suwon-si (KR); Min Gon Lee, Suwon-si (KR); Jae Yeol Choi, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/719,240

(22) Filed: Sep. 28, 2017

(65) Prior Publication Data
US 2018/0174757 A1 Jun. 21, 2018

(30) Foreign Application Priority Data
Dec. 19, 2016 (KR) .................. 10-2016-0173366

(51) Int. Cl.
*H05K 1/02* (2006.01)
*H01G 4/30* (2006.01)
(Continued)

(52) U.S. Cl.
CPC ............. *H01G 4/30* (2013.01); *H01G 4/232* (2013.01); *H01G 4/248* (2013.01); *H05K 1/111* (2013.01);
(Continued)

(58) Field of Classification Search
CPC .. H05K 1/02; H05K 1/16; H05K 1/18; H01G 2/06; H01G 4/01; H01G 4/02; H01G 4/05; H01G 4/12; H01G 4/30; H01G 4/248
(Continued)

(56) References Cited

U.S. PATENT DOCUMENTS 9,048,026 B2  6/2015  Ahn et al.
9,368,280 B2*  6/2016  Park ............... H05K 3/3442
(Continued)

FOREIGN PATENT DOCUMENTS

JP  2007-235170 A  9/2007
KR  10-2006-0084770 A  7/2006
(Continued)

OTHER PUBLICATIONS

Office Action issued in Korean Patent Application No. 10-2016-0173366, dated Jul. 2, 2018 (English translation).
(Continued)

*Primary Examiner* — Xiaoliang Chen
(74) *Attorney, Agent, or Firm* — Morgan Lewis & Bockius LLP

(57) ABSTRACT

A multilayer ceramic capacitor includes a ceramic body, an active layer, dielectric layers being interposed between first internal electrodes and second internal electrodes, an upper cover layer, a lower cover layer, a first external electrode and a second external electrode covering first and second ends of the ceramic body, and the multilayer ceramic capacitor comprising a plurality of internal electrodes disposed within the lower cover layer, when a distance of a longitudinal margin portion from a boundary of a ceramic body of the plurality of internal electrodes disposed in the lower cover layer to an overlapping area is indicated as G, and widths of an upper band portion and a lower band portion of an external electrode disposed in an upper surface and a lower surface at the boundary of the ceramic body are indicated as E1 and E2, G is greater than E1 and G is greater than E2.

13 Claims, 6 Drawing Sheets

(51) Int. Cl.
  *H01G 4/248* (2006.01)
  *H05K 1/11* (2006.01)
  *H01G 4/232* (2006.01)
  *H05K 1/18* (2006.01)
  *H05K 3/34* (2006.01)

(52) U.S. Cl.
  CPC ........... *H05K 1/181* (2013.01); *H05K 3/3442* (2013.01); *H05K 2201/10015* (2013.01)

(58) Field of Classification Search
  USPC ............... 174/260, 258; 361/303.4, 303, 782
  See application file for complete search history.

(56) References Cited

U.S. PATENT DOCUMENTS

| | | | |
|---|---|---|---|
| 2005/0282403 A1* | 12/2005 | Ito | C04B 35/49 438/785 |
| 2006/0158827 A1 | 7/2006 | Lee et al. | |
| 2006/0234853 A1* | 10/2006 | Sasaki | B32B 18/00 501/136 |
| 2007/0025054 A1 | 2/2007 | Tonogai et al. | |
| 2013/0050894 A1* | 2/2013 | Ahn | H01G 4/12 361/306.3 |
| 2013/0058005 A1* | 3/2013 | Oh | H01G 4/005 361/305 |
| 2013/0319741 A1* | 12/2013 | Ahn | H01G 4/30 174/260 |
| 2013/0321981 A1* | 12/2013 | Ahn | H01G 4/30 361/321.2 |
| 2014/0020942 A1* | 1/2014 | Cho | H01G 4/30 174/260 |
| 2014/0083755 A1* | 3/2014 | Lee | H05K 1/181 174/260 |
| 2014/0131082 A1* | 5/2014 | Ahn | H05K 3/3442 174/260 |
| 2014/0133064 A1* | 5/2014 | Ahn | H01G 4/30 361/303 |
| 2014/0138136 A1* | 5/2014 | Ahn | H01G 2/065 174/260 |
| 2014/0144687 A1* | 5/2014 | Ahn | H01G 4/30 174/260 |
| 2014/0290998 A1* | 10/2014 | Ahn | H01G 4/30 174/260 |
| 2015/0014035 A1* | 1/2015 | Park | H01G 2/065 174/260 |
| 2015/0043125 A1* | 2/2015 | Park | H01G 4/12 361/301.4 |
| 2015/0062775 A1* | 3/2015 | Shibasaki | H01G 4/30 361/301.4 |
| 2015/0083477 A1 | 3/2015 | Lee et al. | |
| 2015/0131199 A1* | 5/2015 | Park | H01G 4/30 361/301.4 |
| 2015/0279569 A1* | 10/2015 | Ahn | H01G 4/30 174/260 |
| 2015/0302989 A1* | 10/2015 | Choi | H01G 2/14 29/25.03 |
| 2016/0049252 A1* | 2/2016 | Park | H01G 4/30 174/258 |
| 2016/0099105 A1* | 4/2016 | Lee | H01G 2/065 174/260 |
| 2016/0104577 A1* | 4/2016 | Cho | H01G 4/012 361/301.4 |
| 2016/0189868 A1* | 6/2016 | Sasaki | H01G 4/30 361/301.4 |
| 2017/0084392 A1* | 3/2017 | An | H01G 4/1218 |

FOREIGN PATENT DOCUMENTS

| | | |
|---|---|---|
| KR | 10-2013-0135015 A | 12/2013 |
| KR | 10-2014-0012577 A | 2/2014 |
| KR | 10-2014-0041235 A | 4/2014 |
| KR | 10-2014-0060393 A | 5/2014 |
| KR | 10-2015-0033520 A | 4/2015 |
| KR | 10-2007-0015865 A | 2/2017 |

OTHER PUBLICATIONS

Korean Office Action dated Jan. 11, 2019 issued in Korean Patent Application No. 10-2016-0173366 (with English translation).

\* cited by examiner

MULTILAYER CERAMIC CAPACITOR

CROSS-REFERENCE TO RELATED APPLICATION

This application claims the benefit of priority to Korean Patent Application No. 10-2016-0173366, filed on Dec. 19, 2016 with the Korean Intellectual Property Office, the entirety of which is incorporated herein by reference.

TECHNICAL FIELD

The present disclosure relates to a multilayer ceramic capacitor.

BACKGROUND

A multilayer capacitor, a type of multilayer chip electronic component, is a capacitor in the form of a chip mounted on a circuit board of various electronic products such as an imaging device, including a liquid crystal display (LCD), a plasma display panel (PDP), and the like, a computer, a smartphone, a mobile phone, and the like, to serve to charge or discharge electricity.

The multilayer ceramic capacitor (MLCC) has advantages of being small, enabling high capacitance, and being easily mounted, so an MLCC can be used as a component of various electronic products.

Such a multilayer ceramic capacitor may have a structure in which a plurality of dielectric layers and internal electrodes having different polarities with respective dielectric layers interposed therebetween are stacked.

In a product of a package on which the multilayer ceramic capacitor is mounted, when the multilayer ceramic capacitor receives energy, a certain amount or more of heat and acoustic noise may occur. In addition, when a package product is driven, due to interactions between internal components, a phenomenon in which heat and acoustic noise are enhanced may occur.

In order to reduce acoustic noise, a product having a form in which a thickness of a lower cover layer of a multilayer ceramic capacitor is increased has been studied.

Generally, equivalent series inductance (ESL) is proportional to an area of a current loop.

Thus, as described above, when a thickness of a lower cover layer of a multilayer ceramic capacitor is increased, acoustic noise may be partially reduced. However, a problem, in which ESL is high in comparison with a product having a relatively thin lower cover layer according to the related art, may occur.

Meanwhile, research into a structure in which a lower cover layer includes an internal electrode to improve ESL while a thickness of a lower cover layer of a multilayer ceramic capacitor is increased, as described above, has been undertaken. However, when a bending crack is generated in such a structure, an internal electrode disposed in a lower cover layer may be damaged, and a resulting reduction in capacitance, a reduction in insulation resistance (IR), or the like may be caused.

SUMMARY

An aspect of the present disclosure provides a multilayer capacitor reducing acoustic noise, securing ESL characteristics, and improving reliability, and a board having the same mounted thereon.

According to an aspect of the present disclosure, a multilayer ceramic capacitor includes: a ceramic body in which a plurality of dielectric layers are stacked; an active layer in which a capacitance is formed by including a plurality of first internal electrodes and second internal electrodes disposed to be alternately exposed through both ends of the ceramic body with the dielectric layers interposed therebetween; an upper cover layer formed above the active layer; a lower cover layer formed below the active layer, and having a thickness greater than that of the upper cover layer; and a first external electrode and a second external electrode formed to cover both ends of the ceramic body, and further includes: a plurality of internal electrodes disposed within the lower cover layer, and having an overlapping area, wherein, when a distance of a longitudinal margin portion from a boundary of a ceramic body of the plurality of internal electrodes disposed in the lower cover layer to an overlapping area is taken as G, and widths of an upper band portion and a lower band portion of an external electrode disposed in an upper surface and a lower surface at the boundary of the ceramic body are taken as E1 and E2, a distance of G, among E1, E2, and G, is maximum.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
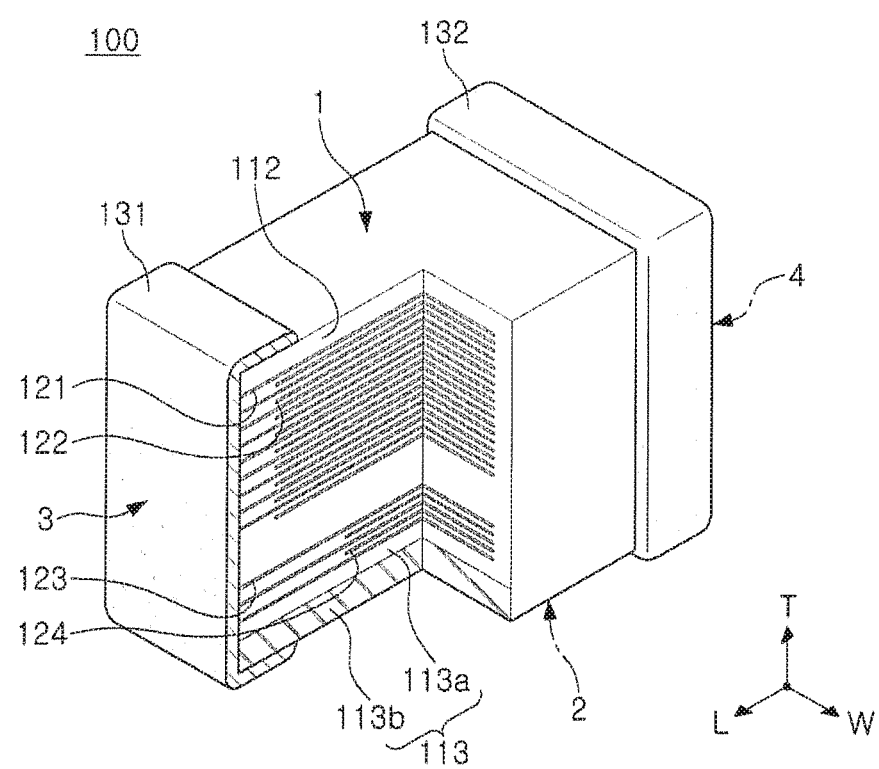
FIG. 1 is a cutaway perspective view illustrating a portion of a multilayer ceramic capacitor according to an exemplary embodiment of the present disclosure.

Hereinafter, exemplary embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being 'on,' 'connected to,' or 'coupled to' another element, it can be directly 'on,' 'connected to,' or 'coupled to' the other element or other elements intervening therebetween may be present. In contrast, when an element is referred to as being 'directly on,' 'directly connected to,' or 'directly coupled to' another element, there may be no other elements or layers intervening therebetween. Like numerals refer to like elements throughout. As used herein, the term 'and/or' includes any and all combinations of one or more of the associated listed items.

It will be apparent that although the terms first, second, third, etc. may be used herein to describe various members, components, regions, layers and/or sections, any such members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as 'above,' 'upper,' 'below,' and 'lower' and the like, may be used herein for ease of description to describe one element's relationship relative to another element(s) as shown in the figures. It will be understood that spatially relative terms are intended to encompass different orientations of the device in use or operation, in addition to the orientation depicted in the figures. For example, if the device in the figures is turned over, elements described as 'above,' or 'upper' relative to other elements would then be oriented 'below,' or 'lower' relative to the other elements or features. Thus, the term 'above' can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms 'a,' 'an,' and 'the' are intended to include the plural forms as well, unless the context clearly indicates otherwise. It will be further understood that the terms 'comprises,' and/or 'comprising' when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, exemplary embodiments of the present disclosure will be described with reference to views illustrating embodiments of the present disclosure. In the drawings, for example, due to manufacturing techniques and/or tolerances, modifications of the shape shown may be estimated. Thus, exemplary embodiments of the present disclosure should not be construed as being limited to the particular shapes of regions shown herein, for example, to include a change in shape resulting from manufacturing. The following exemplary embodiments may also be constituted alone, in combination or in partial combination.

The contents of the present disclosure described below may have a variety of configurations and only a required configuration is proposed herein, and the present disclosure is not limited thereto.

In order to clearly explain examples of the present disclosure, when directions of a hexahedron are defined, L, W, and T illustrated in the drawings indicate a longitudinal direction, a width direction, and a thickness direction, respectively. Here, the thickness direction may be used in the same concept as a stacking direction in which dielectric layers are stacked.

In addition, in exemplary embodiments, for convenience of explanation, surfaces on which a first external electrode and a second external electrode are formed in a longitudinal direction of a body are set as both right and left ends, and surfaces vertically intersecting therewith are set as right and left side surfaces.

Multilayer Ceramic Capacitor

Figure 2:
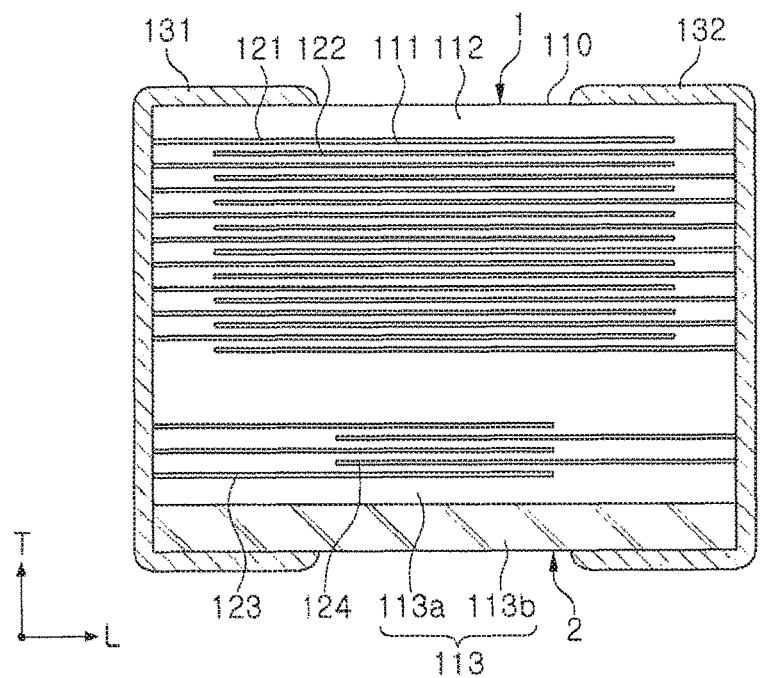
FIG. 2 is a cross-sectional view illustrating the multilayer ceramic capacitor of FIG. 1 in a longitudinal direction.

FIG. 1 is a cutaway perspective view illustrating a multilayer ceramic capacitor according to exemplary embodiments of the present disclosure, and FIG. 2 is a cutaway cross-sectional view illustrating the multilayer ceramic capacitor of FIG. 1 in a longitudinal direction.

With reference to FIGS. 1 and 2, a multilayer ceramic capacitor 100 according to exemplary embodiments of the present disclosure may include a ceramic body 110, an active layer 115 containing a first internal electrode 121 and a second internal electrode 122, an upper cover layer 112 and a lower cover layer 113, and a first external electrode 131 and a second external electrode 132 formed to cover both ends of the ceramic body 110, and may further include a plurality of internal electrodes 123 and 124 disposed in the lower cover layer 113 and having an overlapping area.

The ceramic body 110 is formed as a plurality of dielectric layers 111 stacked and then sintered, and a shape, dimensions of the ceramic body 110, and a stacking number of a dielectric layer 111 are not limited to those illustrated in the exemplary embodiments.

In addition, the dielectric layer 111 is in a sintered state, and boundaries between dielectric layers 111 adjacent each other may be integrated, so that they may be difficult to view without using a scanning electron microscope (SEM).

The ceramic body 110 may include the active layer 115 as a portion contributing to capacitance formation of a capacitor, and the upper cover layer 112 and the lower cover layer 113 formed above and below the active layer 115, respectively, as an upper margin portion and a lower margin portion.

The active layer 115 may be formed by repeatedly stacking a plurality of first internal electrodes 121 and second internal electrodes 122 with the dielectric layers 111 interposed therebetween.

In this case, a thickness of the dielectric layer 111 may be arbitrarily changed according to a capacitance design of the multilayer ceramic capacitor 100. In some examples, a thickness of a single layer may be formed to be 0.01 μm to 1.00 μm after sintering, but the exemplary embodiments are not limited thereto.

In addition, the dielectric layer 111 may include ceramic powder having high dielectric properties, for example, barium titanate ($BaTiO_3$)-based or strontium titanate ($SrTiO_3$)-based powder, but exemplary embodiments are not limited thereto.

The upper cover layer 112 and the lower cover layer 113 may have the same material and configuration as the dielectric layer 111.

The upper cover layer 112 and the lower cover layer 113 may be formed by vertically stacking a single dielectric layer or two or more dielectric layers on an upper surface and a lower surface of the active layer 115, respectively, and may serve to prevent damage to the first internal electrode 121 and the second internal electrode 122 caused by physical or chemical stresses.

In addition, as a stacking number of dielectric layers in the lower cover layer 113 increases, in comparison with the upper cover layer 112, the lower cover layer may have a thickness thicker than that of the upper cover layer.

In this case, ESL is proportional to an area of a current loop. When a thickness of a lower cover layer of a multilayer ceramic capacitor is increased as described above, vibrations of an internal electrode are reduced, so acoustic noise may be reduced, but a problem in which ESL increases may occur.

However, in exemplary embodiments, as the plurality of internal electrodes 123 and 124 are disposed inside the lower cover layer 113, effects of reducing acoustic noise as described above while maintaining ESL at a certain level may be obtained.

An ESL reduction preventing effect as described above may be further improved, when the plurality of internal electrodes 123 and 124 formed in the lower cover layer 113 are formed to be closer to a lower end of the lower cover layer 113.

The first internal electrode 121 and the second internal electrode 122, a pair of electrodes having different polarities, may be formed to be alternately exposed through both ends in a direction in which the dielectric layer 111 is stacked by printing conductive paste containing conductive metal on the dielectric layer 111 to a predetermined thickness, and may be electrically insulated from each other by the dielectric layer 111 interposed therebetween.

In other words, the first internal electrode 121 and the second internal electrode 122 may be electrically connected to the first external electrode 131 and the second external electrode 132, respectively, through portions alternately exposed through both ends of the ceramic body 110.

Thus, when a voltage is applied to the first external electrode 131 and the second external electrode 132, an electric charge is accumulated between the first internal electrode 121 and the second internal electrode 122 opposing each other. In this case, capacitance of the multilayer ceramic capacitor 100 is proportional to an overlapping area of the first internal electrode 121 and the second internal electrode 122.

Thicknesses of the first internal electrode 121 and the second internal electrode 122 may be determined according to an intended use. For example, thicknesses of the first internal electrode and the second internal electrode may be determined to be in a range of 0.2 μm to 1.0 μm in consideration of a size of the ceramic body 110, but exemplary embodiments are not limited thereto.

In addition, the conductive metal contained in the conductive paste forming the first internal electrode 121 and the second internal electrode 122 may be nickel (Ni), copper (Cu), palladium (Pd), or alloys thereof, but exemplary embodiments are not limited thereto.

In addition, a printing method of the conductive paste may be a screen printing method, a gravure printing method, or the like, but exemplary embodiments are not limited thereto.

The first external electrode 131 and the second external electrode 132 may be formed by the conductive paste containing the conductive metal, and the conductive metal may be nickel (Ni), copper (Cu), palladium (Pd), gold (Au), or alloys thereof, but exemplary embodiments are not limited thereto.

Hereinafter, a bending crack transition aspect according to a dimension of components included in a multilayer ceramic capacitor according to exemplary embodiments and a relationship to acoustic noise will be described.

Figure 3:
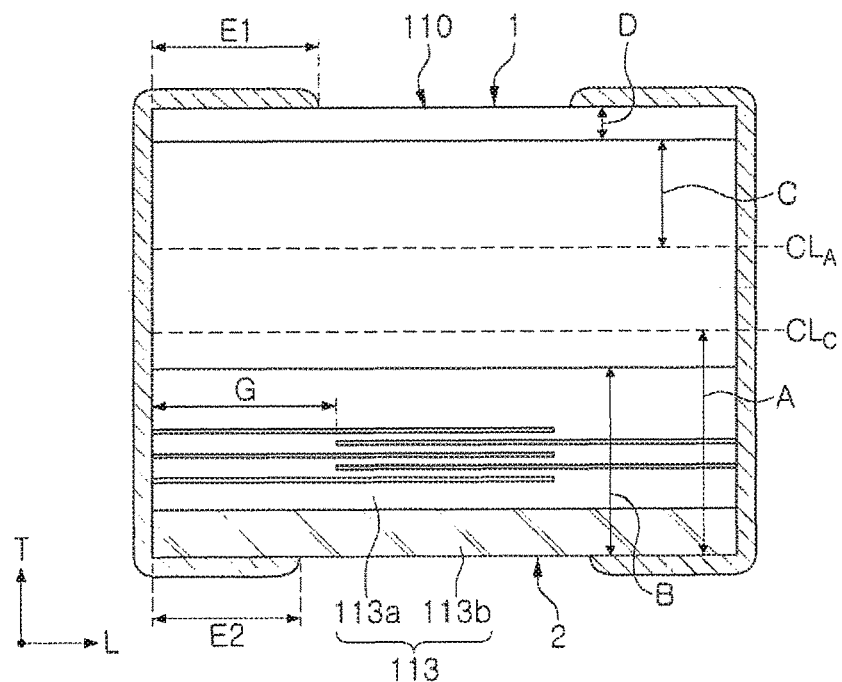
FIG. 3 is a cutaway cross-sectional view schematically illustrating the multilayer ceramic capacitor of FIG. 1 in a longitudinal direction.

FIG. 3 is a cutaway cross-sectional view illustrating the multilayer ceramic capacitor of FIG. 1 in a longitudinal direction to illustrate a dimensional relationship of components included in a multilayer ceramic capacitor.

With reference to FIG. 3, when a distance of a longitudinal margin portion from a boundary of the ceramic body 110 of the plurality of internal electrodes 123 and 124 disposed in the lower cover layer 113 to an overlapping area is taken as G, and widths of an upper band portion and a lower band portion of external electrodes 131 and 132, disposed in an upper surface and a lower surface at a boundary of the ceramic body 110 are taken as E1 and E2, a distance of G, among E1, E2, and G, is maximum.

Here, a distance of a longitudinal margin portion from a boundary of the ceramic body 110 of the plurality of internal electrodes 123 and 124 disposed in the lower cover layer 113 to an overlapping area of the ceramic body 110 refers to a distance of each area in which the plurality of internal electrodes 123 and 124 do not overlap, in a cross section in a length-thickness direction of the ceramic body 110.

In addition, widths of an upper band portion and a lower band portion of external electrodes 131 and 132, disposed in an upper surface and a lower surface at a boundary of the ceramic body 110 refer to a distance from an end of a portion in which the external electrodes 131 and 132 are extended to an upper surface and a lower surface of the ceramic body 110 to a boundary to the ceramic body 110.

Among a distance G of a longitudinal margin portion from a boundary of the ceramic body 110 of the plurality of internal electrodes 123 and 124 disposed in the lower cover layer 113 to an overlapping area, and widths E1 and E2 of an upper band portion and a lower band portion of external electrodes 131 and 132 disposed on an upper surface and a lower surface at a boundary of the ceramic body 110, when the distance G is adjusted to be a maximum, the probability that a crack will transit to an area in which the plurality of internal electrodes 123 and 124 overlap when a bending crack is generated, may be reduced.

Generally, when a bending crack is generated, in a case in which a crack transits to an area in which a plurality of internal electrodes overlap, due to internal electrodes having different polarities, a leakage current is concentrated on an area in which a dielectric crack is generated.

Due to this, an electrical characteristic defect rate such as a short defect, a reduction in insulation resistance (IR), and the like increases, so a problem in which reliability is reduced may occur.

According to exemplary embodiments of the present disclosure, a distance G of a longitudinal margin portion from a boundary of the ceramic body 110 of the plurality of internal electrodes 123 and 124 disposed in the lower cover layer 113 to an overlapping area, and widths E1 and E2 of an upper band portion and a lower band portion of external electrodes, the first external electrode 131 and the second external electrode 132, disposed in an upper surface and a lower surface at a boundary of the ceramic body 110, when the distance G is adjusted to be a maximum, the probability that a crack will transit to an area in which the plurality of internal electrodes 123 and 124 overlap when a bending crack is generated may be reduced.

In other words, as a distance G of a longitudinal margin portion of internal electrodes 123 and 124 disposed in the lower cover layer 113 of a multilayer ceramic capacitor is increased, when a bending crack is generated, a crack is prevented from transiting to an electrode overlap portion, so reliability may be improved.

Meanwhile, with reference to FIG. 3, a half of a total thickness of the ceramic body 110 is defined as A, a thickness of the lower cover layer 113 is defined as B, a half of a total thickness of the active layer 115 is defined as C, and a thickness of the upper cover layer 112 is defined as D.

Here, a total thickness of the ceramic body 110 refers to a distance from an upper surface 1 of the ceramic body 110 to a lower surface 2, and a total thickness of the active layer 115 refers to a distance from an upper surface of the first internal electrode 121 formed in an uppermost portion of the active layer 115 to a lower surface of the second internal electrode formed in a lowermost portion 122 of the active layer 115.

In addition, a thickness B of the lower cover layer 113 refers to a distance from a lower surface of the second internal electrode 122 formed in a lowermost portion in a thickness direction of the active layer 115 to the lower surface 2 of the ceramic body 110, and a thickness D of the upper cover layer 112 refers to a distance from an upper surface of the first internal electrode 121 formed in an uppermost portion in a thickness direction of the active layer 115 to the upper surface 1 of the ceramic body 110.

When voltages having different polarities are applied to the first external electrode 131 and the second external electrode 132 formed in both ends of the multilayer ceramic capacitor 100, the ceramic body 110 is expanded and contracted in a thickness direction due to an inverse piezoelectric effect of the dielectric layer 111, and both ends of the first external electrode 131 and the second external electrode 132 are expanded and contracted, contrary to contraction and expansion in a thickness direction of the ceramic body 110 due to a Poisson effect.

Here, a central portion of the active layer 115 is a portion expanded and contracted to a maximum extent in both ends in a length direction of the first external electrode 131 and the second external electrode 132, and is a factor causing generation of acoustic noise.

In other words, in exemplary embodiments, in order to reduce acoustic noise, due to a difference between the strain in occurring in a central portion $CL_A$ of the active layer 115 and the strain generated in the lower cover layer 113, as a voltage is applied, a point of inflection (PI) formed in both ends of the ceramic body 110 may be formed below a central portion $CL_C$ of a thickness of the ceramic body 110.

In this case, in order to further reduce acoustic noise, a ratio in which the central portion $CL_A$ of the active layer 115 is spaced apart from the central portion $CL_C$ of the ceramic body 110, (B+C)/A may satisfy $1.063 \leq (B+C)/A \leq 1.745$.

In addition, a ratio between the thickness D of the upper cover layer 112 and the thickness B of the lower cover layer 113, D/B satisfies $0.021 \leq D/B \leq 0.422$.

In addition, a ratio of the thickness B of the lower cover layer 113 with respect to a half A of a thickness of the ceramic body 110, B/A satisfies $0.329 \leq B/A \leq 1.522$.

In addition, a ratio of a half C of a thickness of the active layer 115 with respect to the thickness B of the lower cover layer 113, C/B satisfies $0.146 \leq C/B \leq 2.458$.

According to exemplary embodiments of the present disclosure, the lower cover layer 113 may include a buffer layer 113a adjacent the active layer 115 and an identification layer 113b adjacent the lower surface 2 of the ceramic body 110.

A description of the buffer layer 113a is the same as the description of the lower cover layer 113 described above, and the buffer layer may have the same material and configuration as those of the dielectric layer 111.

The buffer layer 113a may be formed by stacking a single dielectric layer or two or more dielectric layers on a lower surface of the active layer 115, and may serve to prevent a damage to the first internal electrode 121 and the second internal electrode 122 caused by physical or chemical stress.

The identification layer 113b is disposed below the buffer layer 113a, and may be adjacent the lower surface 2 of the ceramic body 110.

Since a thickness of the upper cover layer 112 is different from a thickness of the lower cover layer 113 in the ceramic body 110, the identification layer 113b may be placed to identify an upper portion and a lower portion of the ceramic body 110 using a difference in brightness or color.

The identification layer 113b may be a dielectric layer in which a single ceramic green sheet is sintered or a plurality of ceramic green sheets are stacked, and may be included in the lower cover layer 113.

In a dielectric layer, becoming the identification layer 113b, one or more metals selected from nickel (Ni), manganese (Mn), chromium (Cr), and vanadium (V) are added thereto, so there may be a difference in brightness or a color outside the ceramic body 110.

According to exemplary embodiments of the present disclosure, a plurality of internal electrodes disposed in the lower cover layer 113 are formed of a third internal electrode 123 and a fourth internal electrode 124 stacked to be alternately exposed through both ends of the ceramic body 110 with the dielectric layer 111 interposed therebetween, and may be disposed in the buffer layer 113a.

As a distance of a longitudinal margin portion of the third internal electrode 123 and the fourth internal electrode 124 disposed in the lower cover layer 113 increases, when a bending crack is generated, a crack is prevented from transiting to an electrode overlap portion, so reliability may be improved.

Figure 4:
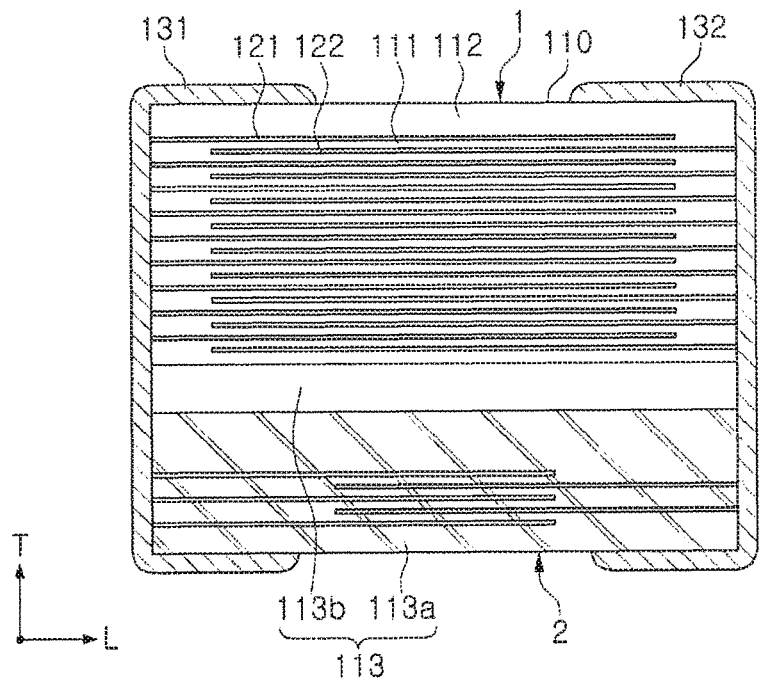
FIG. 4 is a cutaway cross-sectional view illustrating a multilayer ceramic capacitor according to exemplary embodiments of the present disclosure in a longitudinal direction.

FIG. 4 is a cutaway cross-sectional view illustrating a multilayer ceramic capacitor according to exemplary embodiments of the present disclosure in a longitudinal direction.

With reference to FIG. 4, a plurality of internal electrodes disposed in a lower cover layer 113 are formed of a third internal electrode 123 and a fourth internal electrode 124 stacked to be alternately exposed through both ends of the ceramic body 110 with the dielectric layer 111 interposed therebetween, and may be disposed in an identification layer 113b.

According to exemplary embodiments, as a distance of a longitudinal margin portion of the third internal electrode 123 and the fourth internal electrode 124 disposed in the lower cover layer 113 increases, when a bending crack is generated, a crack is prevented from transiting to an electrode overlap portion, so reliability may be improved.

Moreover, in addition thereto, as the third internal electrode 123 and the fourth internal electrode 124 are disposed in the identification layer 113b adjacent the lower surface 2 of the ceramic body 110, an ESL reduction preventing effect may be improved.

Figure 5:
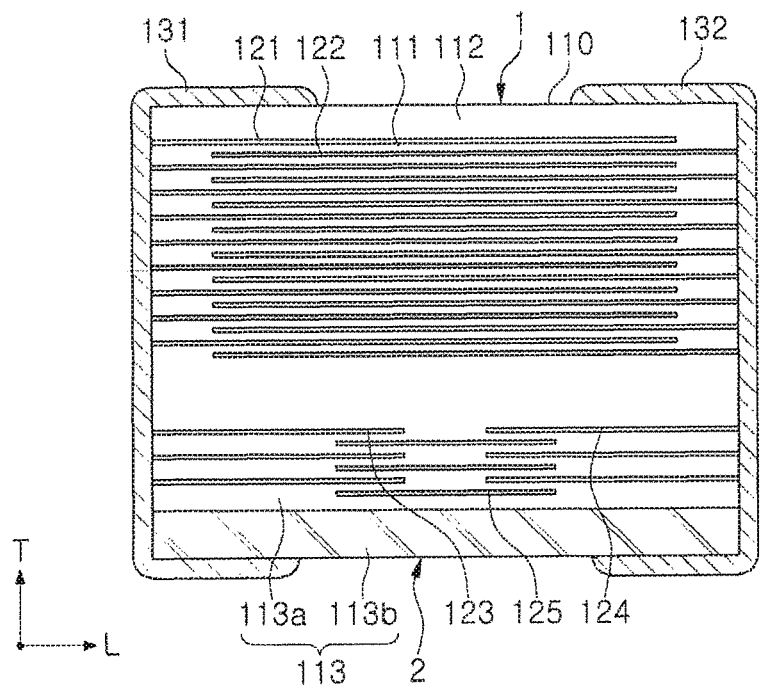
FIG. 5 is a cutaway cross-sectional view illustrating a multilayer ceramic capacitor according to exemplary embodiments of the present disclosure in a longitudinal direction.

FIG. 5 is a cutaway cross-sectional view illustrating a multilayer ceramic capacitor according to exemplary embodiments of the present disclosure in a longitudinal direction.

With reference to FIG. 5, a plurality of internal electrodes disposed in a lower cover layer 113 are formed of a third internal electrode 123 and a fourth internal electrode 124 exposed to both ends of a ceramic body 110 on the same plane, and a floating electrode 125 alternately stacked while forming an area overlapping the third internal electrode 123 and the fourth internal electrode 124 with a dielectric layer 111 interposed therebetween, and spaced apart from both ends of the ceramic body 110, and may be disposed in the buffer layer 113a.

The floating electrode 125 is electrically isolated from a first external electrode and a second external electrode.

The floating electrode 125 is formed in the ceramic body 110 not to be led out to an outer surface of the ceramic body 110, and may be electrically isolated from the first external electrode 131 and the second external electrode 132.

A width of the floating electrode 125 may be the same as a width of each the third internal electrode 123 and the fourth internal electrode 124.

Generally, as a stacking number of internal electrodes increases, a problem in which a breakdown voltage is lowered may occur.

To solve a problem described above, the floating electrode 125 is introduced, so voltages applied to the third internal electrode 123 and the fourth internal electrode 124 may be reduced. In other words, an effect of improving withstand voltage characteristics may be obtained.

In addition, as long as dielectric breakdown does not occur, a stacking number of the third internal electrode 123 and the fourth internal electrode 124 may increase.

The floating electrode 125 may be disposed with the third internal electrode 123 and the fourth internal electrode 124 as well as the dielectric layer 111, interposed therebetween, and may have an area overlapping each of the third internal electrode 123 and the fourth internal electrode 124 when viewed in a stacking direction.

Capacity may be implemented in an area in which the floating electrode 125 as well as the third internal electrode 123 and the fourth internal electrode 124 overlap.

From the point of view of an equivalent circuit, two capacitors are connected in series. As described above, the capacitors are disposed in series, voltages applied to the third internal electrode 123 and the fourth internal electrode 124 may be reduced to half.

Figure 6:
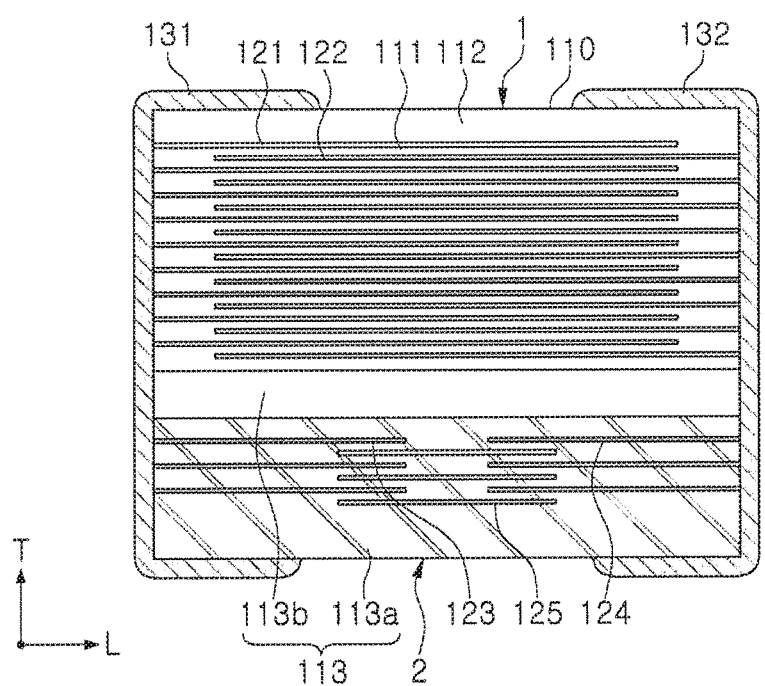
FIG. 6 is a cutaway cross-sectional view illustrating a multilayer ceramic capacitor according to exemplary embodiments of the present disclosure in a longitudinal direction.

FIG. 6 is a cutaway cross-sectional view illustrating a multilayer ceramic capacitor according to exemplary embodiments of the present disclosure in a longitudinal direction.

With reference to FIG. 6, a plurality of internal electrodes disposed in a lower cover layer 113 are formed of a third internal electrode 123 and a fourth internal electrode 124 exposed to both ends of a ceramic body 110 on the same plane, and a floating electrode 125 alternately stacked while forming an area overlapping the third internal electrode 123 and the fourth internal electrode 124 with a dielectric layer 111 interposed therebetween and spaced apart from both ends of the ceramic body 110, and may be disposed in a identification layer 113b.

EXPERIMENTAL EXAMPLE

A multilayer ceramic capacitor according to an Example and a Comparative Example of the present disclosure are manufactured as follows.

A carrier film, formed by containing powder such as barium titanate ($BaTiO_3$), and the like, is coated with slurry and is dried to prepare a plurality of ceramic green sheets manufactured to have a thickness of 1.8 μm.

Next, the ceramic green sheet is coated with a conductive paste for a nickel internal electrode using a screen to form an internal electrode.

The ceramic green sheets are stacked to about 370 layers, and a ceramic green sheet on which an internal electrode is not formed is more stacked in a lower portion than an upper portion, in comparison with a ceramic green sheet on which an internal electrode is formed. A stacked body described above is isostatically pressed under 1000 kgf/cm$^2$ pressure conditions at 85 μm.

A ceramic stacked body having been pressed is cut into the form of individual chips, and a chip having been cut is maintained at 230° C. for 60 hours in an atmospheric environment, so debinding is performed.

Thereafter, so as not to oxidize an internal electrode at 1200° C., the chip is sintered in a reducing atmosphere under oxygen partial pressure of $10^{-11}$ atm to $10^{-10}$ atm, lower than Ni/NiO equilibrium oxygen partial pressure. After sintering, a chip size of a multilayer chip capacitor, a length X a width (L×W) is about 1.64 mm×0.88 mm (L×W, 1608 size). Here, manufacturing tolerance is determined in a range of ±0.1 mm, as a length×a width (L×W). When the manufacturing tolerance is satisfied with the range described above, an experiment is conducted to measure acoustic noise.

Next, passing through the processes of forming of an external electrode, plating, or the like, a multilayer ceramic capacitor is manufactured.

TABLE 1

| Sample | A (μm) | B (μm) | C (μm) | D (μm) | (B + C)/A | B/A | D/B | C/B | AN (dB) | Capacity implementation rate |
|---|---|---|---|---|---|---|---|---|---|---|
| 1* | 405.5 | 40.2 | 365.4 | 39.9 | 1.000 | 0.099 | 0.993 | 9.090 | 29.5 | OK |
| 2* | 436.0 | 70.4 | 365.9 | 69.7 | 1.001 | 0.161 | 0.990 | 5.197 | 25.7 | OK |
| 3* | 455.5 | 90.8 | 364.3 | 91.5 | 0.999 | 0.199 | 1.008 | 4.012 | 23.1 | OK |
| 4* | 508.1 | 24.9 | 361.1 | 269.1 | 0.760 | 0.049 | 10.807 | 14.502 | 31.2 | OK |
| 5* | 456.6 | 25.2 | 360.1 | 167.8 | 0.844 | 0.055 | 6.659 | 14.290 | 32.5 | OK |
| 6* | 527.3 | 30.2 | 191.0 | 642.4 | 0.419 | 0.057 | 21.272 | 6.325 | 30.3 | OK |
| 7* | 414.5 | 30.9 | 188.8 | 420.4 | 0.530 | 0.075 | 13.605 | 6.110 | 30.5 | OK |
| 8* | 516.2 | 39.4 | 360.7 | 271.5 | 0.775 | 0.076 | 6.891 | 9.155 | 28.2 | OK |
| 9* | 446.0 | 39.8 | 365.5 | 121.2 | 0.909 | 0.089 | 3.045 | 9.183 | 29.1 | OK |
| 10* | 469.1 | 40.6 | 364.2 | 169.1 | 0.863 | 0.087 | 4.165 | 8.970 | 27.9 | OK |
| 11* | 416.2 | 40.7 | 360.7 | 70.3 | 0.964 | 0.098 | 1.727 | 8.862 | 28.4 | OK |
| 12* | 428.3 | 40.8 | 360.0 | 95.7 | 0.936 | 0.095 | 2.346 | 8.824 | 28.9 | OK |
| 13* | 495.9 | 40.9 | 364.9 | 221.0 | 0.818 | 0.082 | 5.403 | 8.922 | 28.1 | OK |
| 14* | 435.9 | 25.0 | 421.3 | 4.2 | 1.024 | 0.057 | 0.168 | 16.852 | 31.6 | OK |
| 15* | 420.7 | 70.4 | 365.9 | 39.1 | 1.037 | 0.167 | 0.555 | 5.197 | 25.7 | OK |
| 16 | 431.7 | 94.8 | 364.3 | 40.0 | 1.063 | 0.220 | 0.422 | 3.843 | 19.9 | OK |
| 17 | 443.0 | 103.8 | 389.1 | 4.0 | 1.113 | 0.234 | 0.039 | 3.749 | 19.3 | OK |
| 18 | 443.7 | 119.8 | 363.2 | 41.1 | 1.089 | 0.270 | 0.343 | 3.032 | 18.7 | OK |
| 19 | 447.1 | 147.3 | 362.1 | 22.7 | 1.139 | 0.329 | 0.154 | 2.458 | 17.9 | OK |

TABLE 1-continued

| Sample | A (μm) | B (μm) | C (μm) | D (μm) | (B + C)/A | B/A | D/B | C/B | AN (dB) | Capacity implementation rate |
|---|---|---|---|---|---|---|---|---|---|---|
| 20 | 452.8 | 164.7 | 360.2 | 20.4 | 1.159 | 0.364 | 0.124 | 2.187 | 17.3 | OK |
| 21 | 448.7 | 170.3 | 361.0 | 5.1 | 1.184 | 0.380 | 0.030 | 2.120 | 17.2 | OK |
| 22 | 470.7 | 170.4 | 365.4 | 40.2 | 1.138 | 0.362 | 0.236 | 2.144 | 17.4 | OK |
| 23 | 491.9 | 220.3 | 360.8 | 41.8 | 1.181 | 0.448 | 0.190 | 1.638 | 16.9 | OK |
| 24 | 500.6 | 270.2 | 360.5 | 9.9 | 1.260 | 0.540 | 0.037 | 1.334 | 16.8 | OK |
| 25 | 516.9 | 270.4 | 361.8 | 39.7 | 1.223 | 0.523 | 0.147 | 1.338 | 16.7 | OK |
| 26 | 502.1 | 364.9 | 312.3 | 14.7 | 1.349 | 0.727 | 0.040 | 0.856 | 16.6 | OK |
| 27 | 407.5 | 421.8 | 189.1 | 14.9 | 1.499 | 1.035 | 0.035 | 0.448 | 16.6 | OK |
| 28 | 445.8 | 493.3 | 179.3 | 39.7 | 1.509 | 1.107 | 0.080 | 0.363 | 16.5 | OK |
| 29 | 433.7 | 632.0 | 160.1 | 15.2 | 1.638 | 1.307 | 0.024 | 0.253 | 16.4 | OK |
| 30 | 520.0 | 643.4 | 190.7 | 15.2 | 1.604 | 1.237 | 0.024 | 0.296 | 16.4 | OK |
| 31 | 486.4 | 685.3 | 121.1 | 45.3 | 1.658 | 1.409 | 0.066 | 0.177 | 16.4 | OK |
| 32 | 507.2 | 742.7 | 120.8 | 30.1 | 1.702 | 1.464 | 0.041 | 0.163 | 16.4 | OK |
| 33 | 515.2 | 773.9 | 118.2 | 20.1 | 1.732 | 1.502 | 0.026 | 0.153 | 16.4 | OK |
| 34 | 524.5 | 798.2 | 116.9 | 16.9 | 1.745 | 1.522 | 0.021 | 0.146 | 16.3 | OK |
| 35* | 533.4 | 832.4 | 109.8 | 14.8 | 1.766 | 1.561 | 0.018 | 0.132 | 16.3 | NG |
| 36* | 533.3 | 841.1 | 105.3 | 14.9 | 1.775 | 1.577 | 0.018 | 0.125 | 16.3 | NG |
| 37* | 534.1 | 849.7 | 101.2 | 16.1 | 1.780 | 1.591 | 0.019 | 0.119 | 16.3 | NG |

*is a Comparative Example, AN: acoustic noise

Data in Table 1 is obtained by measuring each dimension based on an image of a cross section, in which a central portion in a width direction W of the ceramic body 110 of the multilayer ceramic capacitor 100, as illustrated in FIG. 3, is cut in a length direction L and a thickness direction T, captured with a scanning electron microscope (SEM).

Here, with respect to A, B, C, and D, as illustrated above, a half of a total thickness of the ceramic body 110 is defined as A, a thickness of the lower cover layer 113 is defined as B, a half of a total thickness of the active layer 115 is defined as C, and a thickness of the upper cover layer 112 is defined as D.

In order to measure acoustic noise, after a single sample (a multilayer chip capacitor) per a board for measuring acoustic noise is placed in a vertical direction and then is mounted on a printed circuit board, the board is mounted on a jig for measuring.

In addition, a DC power supply and signal generator (function generator) are used to apply DC voltage and voltage fluctuation are applied to both terminals of the sample mounted on the jig for measuring. Through a microphone installed directly above the printed circuit board, acoustic noise is measured.

In Table 1, samples 1 to 3 are Comparative Examples having a cover symmetric structure in which a thickness B of the lower cover layer 113 is substantially similar to a thickness D of the upper cover layer 112, and samples 4 to 13 are Comparative Examples in which a thickness D of the upper cover layer 112 is thicker than a thickness B of a lower cover layer.

In addition, samples 14, 15, and 35 to 37 are Comparative Examples having a structure in which a thickness B of the lower cover layer 113 is thicker than a thickness D of the upper cover layer 112, and samples 16 to 34 are Examples according to exemplary embodiments of the present disclosure.

Here, the case, in which a value of (B+C)/A is substantially 1, refers to the case in which a central portion of the active layer 115 is not significantly spaced apart from a central portion of the ceramic body 110. A value of (B+C)/A of each of samples 1 to 3 having a cover symmetric structure in which a thickness B of the lower cover layer 113 is substantially similar to a thickness D of the upper cover layer 112 is substantially 1.

The case, in which a value of (B+C)/A is greater than 1, refers to the case in which a central portion of the active layer 115 is spaced apart from a central portion of the ceramic body 110 upwards. The case, in which a value of (B+C)/A is smaller than 1, refers to the case in which a central portion of the active layer 115 is spaced apart from a central portion of the ceramic body 110 downwards.

Referring to Table 1, in samples 16 to 34, which are Examples in which a ratio, in which a central portion of the active layer 115 is spaced apart from a central portion of the ceramic body 110, (B+C)/A, satisfies $1.063 \leq (B+C)/A \leq 1.745$, acoustic noise is confirmed to be significantly reduced to be less than 20 dB.

In addition, samples 1 to 15 in which, a ratio, in which a central portion of the active layer 115 is spaced apart from a central portion of the ceramic body 110, (B+C)/A is less than 1.063, have a structure in which a central portion of the active layer 115 is not substantially spaced apart from a central portion of the ceramic body 110, or a central portion of the active layer 115 is spaced apart from a central portion of the ceramic body 110 downwards.

In the sample 1 to 15, in which (B+C)/A is less than 1.063, acoustic noise is 25 dB to 32.5 dB, so it is confirmed that an acoustic noise reduction effect is not significant in comparison with an Example according to the embodiments of present disclosure.

In addition, in the case of samples 35 to 37, in which a ratio, in which a central portion of the active layer 115 is spaced apart from a central portion of the ceramic body 110, (B+C)/A exceeds 1.745, in comparison with target capacitance, capacitance is low, so a capacitance defect occurs.

In Table 1, the case in which a capacitance implementation rate (In other words, a ratio of capacitance in comparison with target capacitance) is taken as "NG", refers to a case in which a capacitance value in comparison with target capacitance is less than 80%, when a target capacitance value is 100%.

In addition, in Examples in which a ratio D/B of a thickness D of the upper cover layer 112 to a thickness B of the lower cover layer 113 satisfies $0.021 \leq D/B \leq 0.422$, it is confirmed that acoustic noise is significantly reduced.

On the other hand, in Comparative Examples, in which a ratio D/B of a thickness D of the upper cover layer 112 to a thickness B of the lower cover layer 113 exceeds 0.422, it is confirmed that an acoustic noise reduction effect is not significant.

When a ratio D/B of a thickness D of the upper cover layer 112 to a thickness B of the lower cover layer 113 is less than 0.021, the thickness B of the lower cover layer 113 is significantly greater than the thickness D of the upper cover layer 112, so a crack or delamination may occur; and capacitance is low in comparison with target capacitance, so a capacitance defect may occur.

Among Examples, in the case of samples 19 to 34, Examples in which a ratio B/A of a thickness B of the lower cover layer 113 with respect to a thickness A of the ceramic body 110, and a ratio C/B of a thickness C of the active layer 115 with respect to a thickness B of the lower cover layer 113 satisfy $0.329 \le B/A \le 1.522$ and $0.146 \le C/B \le 2.458$, respectively, it is confirmed that acoustic noise is further reduced to be less than 18 dB.

On the other hand, in the case of samples 35 to 37, in which a ratio B/A of a thickness B of the lower cover layer 113 with respect to a thickness A of the ceramic body 110 exceeds 1.522, or a ratio C/B of a thickness C of the active layer 115 with respect to a thickness B of the lower cover layer 113 is less than 0.146, in comparison with target capacitance, capacitance is low, so a problem in which a capacitance defect occurs may occur.

Board Having Multilayer Ceramic Capacitor Mounted Thereon

Figure 7:
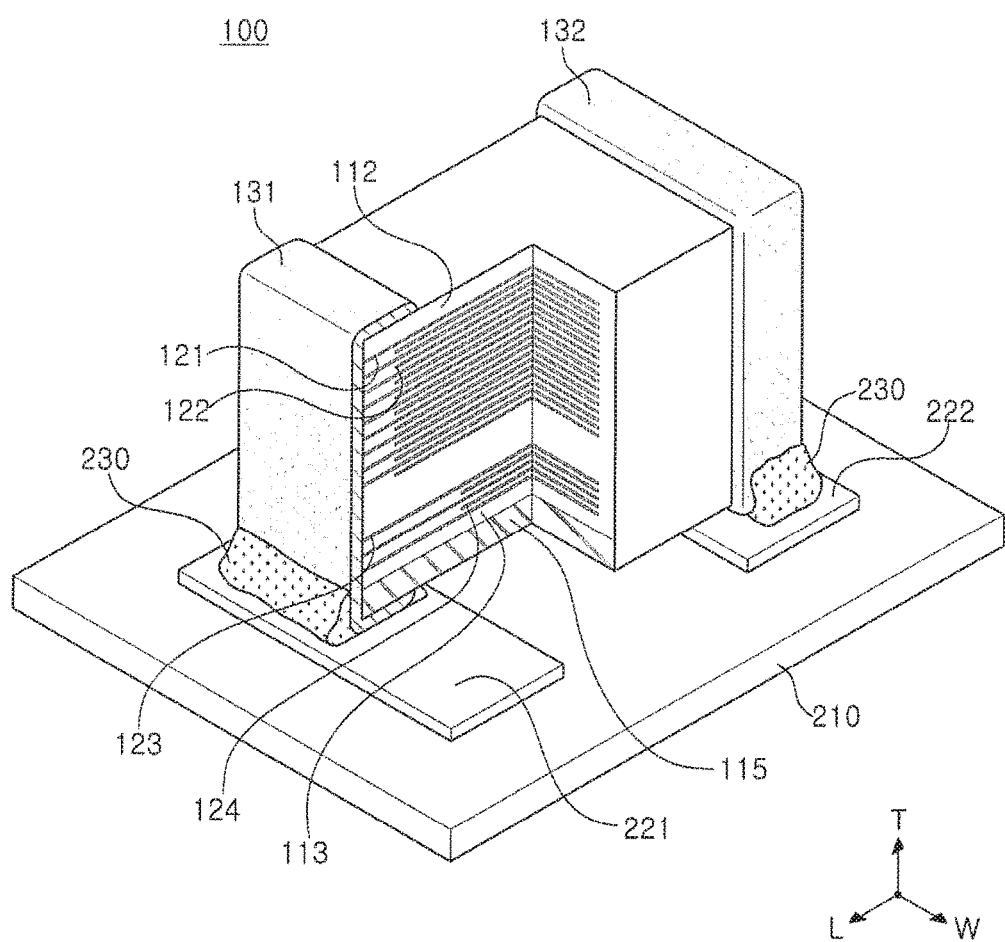
FIG. 7 is a perspective view illustrating the multilayer ceramic capacitor of FIG. 1 mounted on a printed circuit board.

FIG. 7 is a perspective view illustrating the multilayer ceramic capacitor of claim 1 mounted on a printed circuit board.

Figure 8:
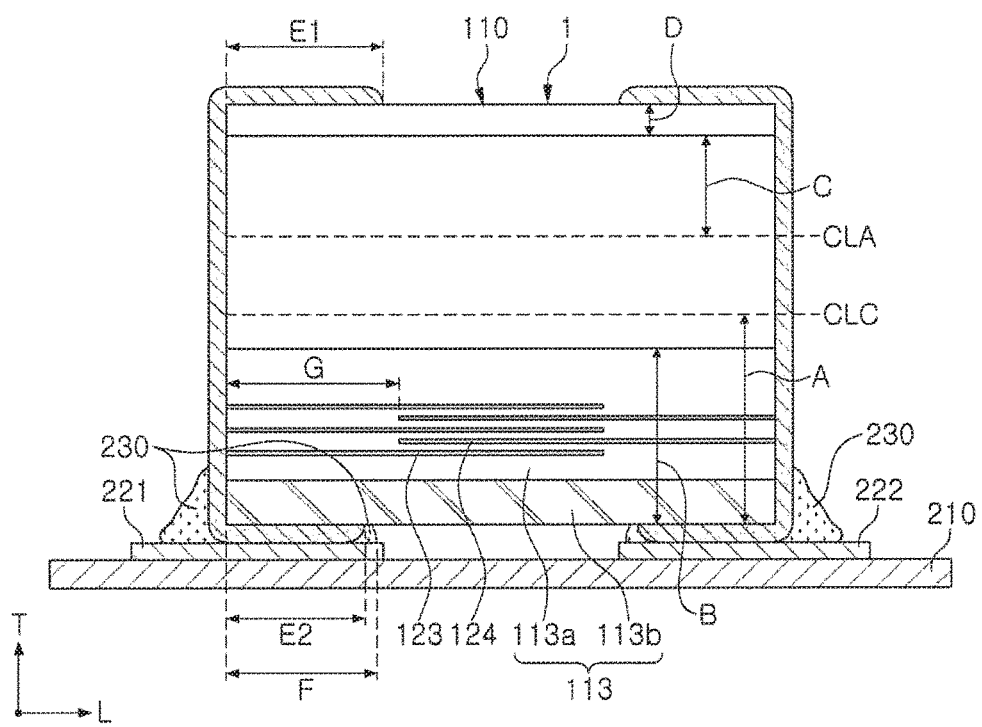
FIG. 8 is a cutaway cross-sectional view illustrating the multilayer ceramic capacitor and the printed circuit board of FIG. 6 in a longitudinal direction.

FIG. 8 is a cutaway cross-sectional view illustrating the multilayer ceramic capacitor of claim 6 and a printed circuit board in a longitudinal direction.

Descriptions of components the same as those illustrated in FIGS. 1 to 3 will be omitted.

With reference to FIGS. 7 and 8, a board having a multilayer capacitor mounted thereon to which a multilayer capacitor 100 according to exemplary embodiments of the present disclosure is applied may include a board 210 on which the multilayer capacitor 100 is horizontally mounted, and a first electrode pad 221 and a second electrode pad 222 formed to be spaced apart from an upper surface of the board 210.

In this case, the multilayer capacitor 100 is mounted to allow a lower surface 2 of a ceramic body 110 to oppose the board 210, and the first external electrode 131 and the second external electrode 132 may be electrically connected to the board 210 by a solder 230 while located to be in contact with the first electrode pad 221 and the second electrode pad 222.

When a distance of a longitudinal margin portion from a boundary of a ceramic body of a plurality of internal electrodes disposed in the lower cover layer to an overlapping area is taken as G, widths of an upper band portion and a lower band portion of an external electrode disposed in an upper surface and a lower surface at boundary of the ceramic body are taken as E1 and E2, and a distance from a boundary of the ceramic body to an end point of a solder disposed inwardly is taken as F, a distance of G, among E1, E2, F, and G, may be s maximum.

According to exemplary embodiments of the present disclosure, a distance G of a longitudinal margin portion of an internal electrode disposed in a lower cover layer of a multilayer ceramic capacitor increases to be greater than widths E1 and E2 of an upper band portion and a lower band portion of an external electrode disposed in an upper surface and a lower surface at boundary of the ceramic body, and a distance F from a boundary of the ceramic body to an end point of a solder disposed inwardly. Thus, when a bending crack is generated, a crack is prevented from transiting to an electrode overlap portion, so reliability may be improved.

Table 2 is a table illustrating the number of occurrences of a bending crack, a short, the number of IR defect, and an electrical characteristic defect rate thereby, according to a distance G of a longitudinal margin portion of an internal electrode disposed in a lower cover layer of a multilayer ceramic capacitor, widths E1 and E2 of an upper band portion and a lower band portion of an external electrode disposed in an upper surface and a lower surface at a boundary of the ceramic body, and a distance F from a boundary of the ceramic body to an end point of a solder disposed inwardly.

TABLE 2

| Sample | Design length comparison | Bending crack occurrence number | Short defect number | IR defect number | Electrical characteristic defect rate |
|---|---|---|---|---|---|
| 1 | MIN (E1, E2, F) > G | 9/300 | 2/9 | 3/9 | 55.6% |
| 2 | MIN (E1, E2, F) = G | 8/300 | 1/8 | 2/8 | 37.5% |
| 3 | MIN (E1, E2, F) < G | 8/300 | 0/8 | 0/8 | 0.0% |

Referring to Table 2, according to minimum values MIN (E1, E2, and F) of widths E1 and E2 of an upper band portion and a lower band portion of an external electrode disposed in an upper surface and a lower surface of a boundary of a ceramic body, and a distance F from a boundary of the ceramic body to an end point of a solder disposed inwardly, and a distance G of a longitudinal margin portion of an internal electrodes disposed in a lower cover layer, the number of occurrences of a bending crack, a short, the number of IR defect, and an electrical characteristic defective ratio thereby are illustrated.

In the case of a sample 1, in which MIN (E1, E2, F)>G, according to occurrences of a bending crack, a short defect and IR defect occur, so it is confirmed that an electrical characteristic defect rate is 55.6%.

In the case of a sample 2, in which MIN (E1, E2, F)=G, likewise, according to occurrences of a bending crack, a short defect and IR defect occur, so it is confirmed that an electrical characteristic defect rate is 37.5%.

However, in the case of a sample 3, an exemplary embodiment of the present disclosure, in which MIN (E1, E2, F)<G, according to occurrences of a bending crack, a short defect and IR defect do not occur at all, so it is confirmed that an electrical characteristic defect rate is 0.0%.

Thus, as a distance G of a longitudinal margin portion of an internal electrode disposed in a lower cover layer of a multilayer ceramic capacitor increases to be greater than widths E1 and E2 of an upper band portion and a lower band portion of an external electrode disposed in an upper surface and a lower surface at a boundary of the ceramic body and a distance F from a boundary of the ceramic body to an end point of a solder disposed inwardly, when a bending crack is generated, a crack is prevented from transiting to an electrode overlap portion. Therefore, a short defect and IR defect do not occur at all, so it is confirmed that reliability is improved.

As set forth above, according to exemplary embodiments, as a distance of a longitudinal margin portion of an internal electrode disposed in a lower cover layer of a multilayer ceramic capacitor increases, when a bending crack is generated, a crack is prevented from transiting to an electrode overlap portion, so reliability may be improved.

In addition to effects described above, as a vibration occurring in a multilayer ceramic capacitor is reduced, also acoustic noise occurring in a printed circuit board may be reduced while a level of ESL may be maintained below a certain level.

While exemplary embodiments of the present disclosure have been shown and described above, it will be apparent to those skilled in the art that modifications and variations could be made without departing from the scope of the present disclosure as defined by the appended claims.

What is claimed is:

1. A multilayer ceramic capacitor, comprising:
   a ceramic body in which a plurality of dielectric layers are stacked;
   an active layer in which a capacitance is formed by including a plurality of first internal electrodes and second internal electrodes having a first overlapping area and alternately exposed through a first end and a second end of the ceramic body, the dielectric layers being interposed between the first internal electrodes and the second internal electrodes;
   an upper cover layer disposed above the active layer;
   a lower cover layer formed below the active layer, and having a thickness greater than that of the upper cover layer;
   a first external electrode and a second external electrode covering the first and second ends of the ceramic body, and
   the multilayer ceramic capacitor further comprising:
   a plurality of internal electrodes disposed within the lower cover layer, and having a second overlapping area,
   wherein G is greater than E1 and E2, where a distance of a longitudinal margin portion from a boundary of the ceramic body to the second overlapping area of the plurality of internal electrodes disposed in the lower cover layer is indicated as G, and widths of an upper band portion and a lower band portion of an external electrode disposed in an upper surface and a lower surface at the boundary of the ceramic body are indicated as E1 and E2, and
   wherein a distance of a longitudinal margin portion from the boundary of the ceramic body to the first overlapping area of the plurality of first and second internal electrodes disposed in the active area is less than E1 and E2.

2. The multilayer ceramic capacitor of claim 1, wherein, when a half of a total thickness of the ceramic body is indicated 5 as A, a thickness of the lower cover layer is indicated as B, a half of a total thickness of the active layer is indicated as C, and a thickness of the upper cover layer is indicated as D, a ratio, in which a central portion of the active layer is spaced apart from a central portion of the ceramic body, (B+C)/A satisfies $1.063 \leq (B+C)/A \leq 1.745$.

3. The multilayer ceramic capacitor of claim 1, wherein a ratio between a thickness D of the upper cover layer and a thickness B of the lower cover layer, D/B, satisfies $0.021 \leq D/B \leq 0.422$.

4. The multilayer ceramic capacitor of claim 1, wherein a ratio of a thickness B of the lower cover layer with respect to a half A of a thickness of the ceramic body B/A satisfies $0.329 \leq B/A \leq 1.522$.

5. The multilayer ceramic capacitor of claim 1, wherein a ratio of a half C of a thickness of the active layer with respect to a thickness B of the lower cover layer, C/B satisfies $0.146 \leq C/B \leq 2.458$.

6. The multilayer ceramic capacitor of claim 1, wherein the lower cover layer includes a buffer layer adjacent the active layer and an identification layer adjacent a lower surface of the ceramic body.

7. The multilayer ceramic capacitor of claim 6, wherein the plurality of internal electrodes disposed in the lower cover layer are formed of a third internal electrode and a fourth internal electrode stacked to be alternately exposed through the first and second ends of the ceramic body with the dielectric layers interposed therebetween, and the third and fourth internal electrodes are disposed in the buffer layer.

8. The multilayer ceramic capacitor of claim 6, wherein the plurality of internal electrodes disposed in the lower cover layer are formed of a third internal electrode and a fourth internal electrode stacked to be alternately exposed through the first and second ends of the ceramic body with the dielectric layers interposed therebetween, and the third and fourth internal electrodes are disposed in the identification layer.

9. The multilayer ceramic capacitor of claim 6, wherein the plurality of internal electrodes disposed in the lower cover layer are formed of a third internal electrode and a fourth internal electrode exposed to the first and second ends of the ceramic body on the same plane and a floating electrode alternately stacked while forming an area overlapping the third internal electrode and the fourth internal electrode with the dielectric layers interposed therebetween and spaced apart from the first and second ends of the ceramic body, and the third and fourth internal electrodes disposed in the buffer layer.

10. The multilayer ceramic capacitor of claim 6, wherein the plurality of internal electrodes disposed in the lower cover layer are formed of a third internal electrode and a fourth internal electrode exposed to the first and second ends of the ceramic body on the same plane, and a floating electrode alternately stacked while forming an area overlapping the third internal electrode and the fourth internal electrode with the dielectric layers interposed therebetween and spaced apart from the first and second ends of the ceramic body, and the third and fourth internal electrodes are disposed in the identification layer.

11. A board having a multilayer ceramic capacitor mounted thereon, comprising:
   a printed circuit board having a first electrode pad and a second electrode pad disposed above the printed circuit board;
   the multilayer ceramic capacitor of claim 1 installed on the printed circuit board; and
   a solder connecting a first external electrode and a second external electrode of the multilayer ceramic capacitor to the first electrode pad and the second electrode pad, respectively.

12. The board having a multilayer ceramic capacitor mounted thereon of claim 11, wherein, when a distance from a boundary of a ceramic body to an end point of the solder disposed inwardly is taken as F, a distance of G, among E1, E2, F and G, is a maximum.

13. The multilayer ceramic capacitor of claim 6, wherein the identification layer includes one or more metals selected from nickel (Ni), manganese (Mn), chromium (Cr), and vanadium (V).

* * * * *